(12) United States Patent  
Vodrahalli et al.

(10) Patent No.: US 9,040,348 B2  
(45) Date of Patent: May 26, 2015

(54) ELECTRONIC ASSEMBLY APPARATUS AND ASSOCIATED METHODS

(75) Inventors: Nagesh Vodrahalli, Los Altos, CA (US); Jon M. Long, Livermore, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/607,481

(22) Filed: Sep. 7, 2012

(65) Prior Publication Data

US 2013/0071969 A1   Mar. 21, 2013

Related U.S. Application Data

(60) Provisional application No. 61/535,800, filed on Sep. 16, 2011.

(51) Int. Cl.  
*H01L 21/00* (2006.01)  
*H01L 21/44* (2006.01)  
*H01L 25/065* (2006.01)  
*H01L 23/00* (2006.01)

(52) U.S. Cl.  
CPC ... H01L 25/0657 (2013.01); *H01L 2224/13147* (2013.01); *H01L 2224/1403* (2013.01); *H01L 2224/1703* (2013.01); *H01L 2225/06517* (2013.01); *H01L 2225/06513* (2013.01); H01L 24/11 (2013.01); *H01L 24/13* (2013.01); H01L 24/14 (2013.01); *H01L 24/16* (2013.01); H01L 24/17 (2013.01); *H01L 24/81* (2013.01); *H01L 2224/1146* (2013.01); *H01L 2224/11845* (2013.01); *H01L 2224/13082* (2013.10); *H01L 2224/13111* (2013.10); *H01L 2224/16145* (2013.10); *H01L 2224/81191* (2013.10); *H01L 2224/81203* (2013.10); *H01L 2224/11474* (2013.10); *H01L 2224/11906* (2013.10); *H01L 2224/29099* (2013.10); *H01L 2224/32225* (2013.10); *H01L 2224/73253* (2013.10)

(58) Field of Classification Search  
None  
See application file for complete search history.

(56) References Cited

U.S. PATENT DOCUMENTS

| | | | |
|---|---|---|---|
| 5,434,745 A | 7/1995 | Shokrgozar et al. | |
| 6,212,767 B1 | 4/2001 | Tandy | |
| 6,765,299 B2 * | 7/2004 | Takahashi et al. | 257/777 |
| 7,045,390 B2 | 5/2006 | Milla et al. | |
| 8,558,392 B2 * | 10/2013 | Chua et al. | 257/777 |
| 2005/0167798 A1 * | 8/2005 | Doan | 257/678 |
| 2008/0032449 A1 | 2/2008 | Tan et al. | |
| 2008/0157324 A1 | 7/2008 | Tang et al. | |
| 2009/0091025 A1 * | 4/2009 | Wong et al. | 257/737 |
| 2010/0062563 A1 | 3/2010 | Pressel et al. | |
| 2010/0279463 A1 | 11/2010 | Hsiao et al. | |
| 2012/0038061 A1 * | 2/2012 | Su et al. | 257/777 |
| 2012/0292745 A1 * | 11/2012 | Park et al. | 257/621 |

* cited by examiner

*Primary Examiner* — Scott B Geyer  
(74) *Attorney, Agent, or Firm* — Law Offices of Maximilian R. Peterson

(57) ABSTRACT

A method of fabricating an electronic assembly includes fabricating first and second interconnects. The first interconnect is adapted to interconnect a first die to a substrate. The second interconnect is adapted to interconnect the first die to a second die. The method further includes assembling the first die, the second die, and the substrate together such that the first die is disposed above the substrate, and the second die is disposed below the first die.

23 Claims, 18 Drawing Sheets

| Flow No. | Type of Die | Tall Pillar | Short Pillar/ Microbump | Standard Pads |
|---|---|---|---|---|
| Flow 1 | Large Device Die | YES | YES | -- |
| | Small Device Die (Daughter Die) | -- | -- | YES |
| | Package Substrate | -- | -- | YES |
| Flow 2 | Large Device Die | YES | -- | -- |
| | Small Device Die (Daughter Die) | -- | YES | -- |
| | Package Substrate | -- | -- | YES |
| Flow 3 | Large Device Die | -- | YES | -- |
| | Small Device Die (Daughter Die) | -- | -- | YES |
| | Package Substrate | YES | -- | -- |
| Flow 4 | Large Device Die | -- | -- | YES |
| | Small Device Die (Daughter Die) | -- | YES | -- |
| | Package Substrate | YES | -- | -- |

Fig. 10

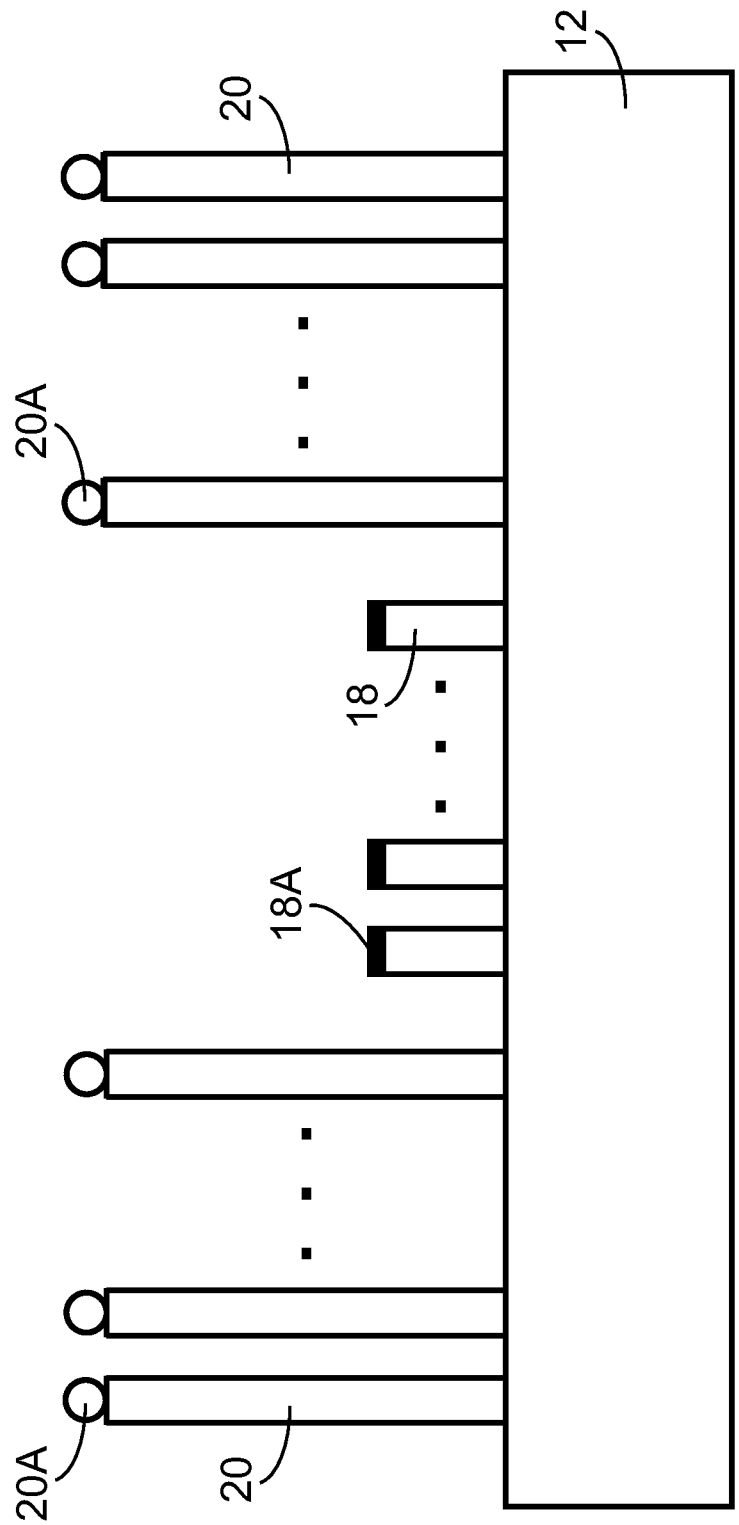

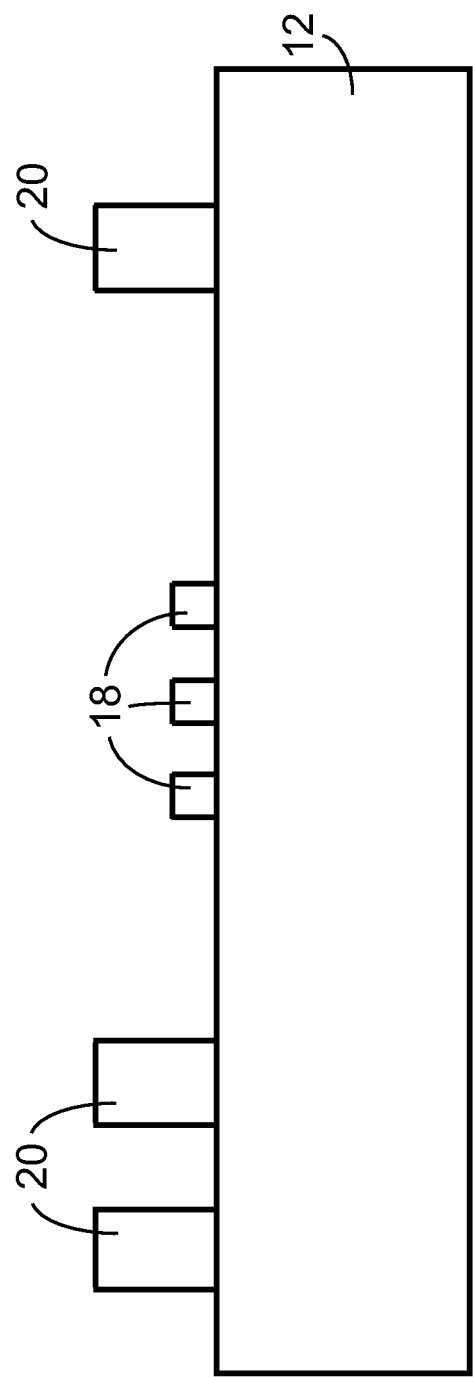

ELECTRONIC ASSEMBLY APPARATUS AND ASSOCIATED METHODS

CROSS-REFERENCE TO RELATED APPLICATIONS

This application claims priority to U.S. Provisional Patent Application Ser. No. 61/535,800, filed on Sep. 16, 2011, titled "Electronic Assembly Apparatus and Associated Methods". The foregoing U.S. Provisional Patent Application is incorporated by reference in its entirety for all purposes.

Furthermore, this application relates to concurrently filed U.S. patent application Ser. No. 13/607,460, titled 'Electronic Assembly Apparatus and Associated Methods'.

TECHNICAL FIELD

The disclosed concepts relate generally to electronic assemblies and, more particularly, to apparatus for 3D (three-dimensional) integration of semiconductor die used in electronic systems, and associated methods.

BACKGROUND

As different from single chip packages, multichip packages interconnect several semiconductor die. In the case of 2D (two-dimensional) based multichip modules (MCM), chips or die are interconnected on a substrate using flip chip or wire bond interconnects. Some 3D interconnects use through silicon vias (TSVs) on either the active silicon circuit die or passive silicon substrates. As an intermediate level, 2D interconnect structures involve a silicon substrate as an interconnect substrate (known as interposer) to provide high density interconnects, using wire bond or flip chip interconnects, sometimes known as 2.5D. Flip chip interconnects may be used to provide higher interconnect density due to the area nature of the interconnect, and provide higher frequency capability due to short electrical distances. The silicon interposer entails additional costs, and there may also be longer electrical distances between the interconnected semiconductor die.

As an alternative to 2.5D and the interposer, a different architecture, namely connecting the die face to face may be used. While the interconnecting the two die can be accomplished in a shorter electrical distance and with the elimination of the interposer substrate, the technique still interconnects the combination of the interconnected die to the outside world. While the face to face interconnecting of the two die can be done using either flip chip solder or copper microbumps, connection to the outside of the 2-die stack is accomplished using wire bond. With this technique, limitations may be encountered in the number of input/outputs (I/Os) and frequency limitations experienced by wire bonds. The flip chip solder interconnect for interconnecting to the outside world may be used when one interconnects the two face to face dies using microbumps.

The spherical nature of the flip chip solder dictates both the height and the I/O pitch, either limiting the height for higher I/O or limiting the I/O density to provide taller interconnects—height of the solder is critical so as to avoid the daughter die interfering with the bottom substrate. The bottom die also usually has to be thin enough to fit in the space between the top die and the substrate. For a typical flip chip external interconnect, the bottom die may be as thin as 50 microns (micrometers), which may entail more complex handling and higher cost. Flip chip external interconnect entails I/O density and die-thickness considerations. This technique also entails processing of copper microbumps and solder (lead-tin or lead free), a different material, by wafer manufacturers. Sometimes, this technique may encounter potential incompatibilities.

SUMMARY

A variety of apparatus and techniques for electronic assemblies including multiple die and a substrate are contemplated. In one exemplary embodiment, a method of fabricating an electronic assembly includes fabricating first and second interconnects. The first interconnect is adapted to interconnect a first die to a substrate. The second interconnect is adapted to interconnect the first die to a second die. The method further includes assembling the first die, the second die, and the substrate together such that the first die is disposed above the substrate, and the second die is disposed below the first die.

In another exemplary embodiment, a method of fabricating an electronic assembly includes fabricating first, second, and third interconnects. The first interconnect is adapted to interconnect a first die to a substrate. The second interconnect is adapted to interconnect the first die to a second die, and the third interconnect is adapted to interconnect the first die to a third die. The method further includes assembling the first die, the second die, the third die, and the substrate together such that the first die is disposed above the substrate, the second die is disposed below the first die, and the third die is disposed below the first die.

In another exemplary embodiment, a method of fabricating an electronic assembly includes fabricating a first interconnect on a first die, and fabricating a second interconnect on the first die. The method further includes interconnecting a second die to the first die using the second interconnect, and interconnecting the first die to a substrate using the first interconnect such that the first die and the second die are disposed above the substrate.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

FIG. 10 depicts a summary of the features and attributes of fabrication or processing flows according to exemplary embodiments.

FIG. 11 shows steps in fabrication or assembly of structures according to an exemplary embodiment.

FIGS. 13-19 illustrate an interconnect assembly or package according to an exemplary embodiment during various stages of fabrication.

DETAILED DESCRIPTION

The disclosed concepts relate generally to electronic assemblies and, more particularly, to apparatus for 3D (three-dimensional) integration of semiconductor die used in electronic systems, and associated methods. The disclosed concepts provide for multi-die integration architectures using face to face stacking of the die, and associated methods, such as process flows, manufacture, fabrication, integration, etc.

Figure 1:
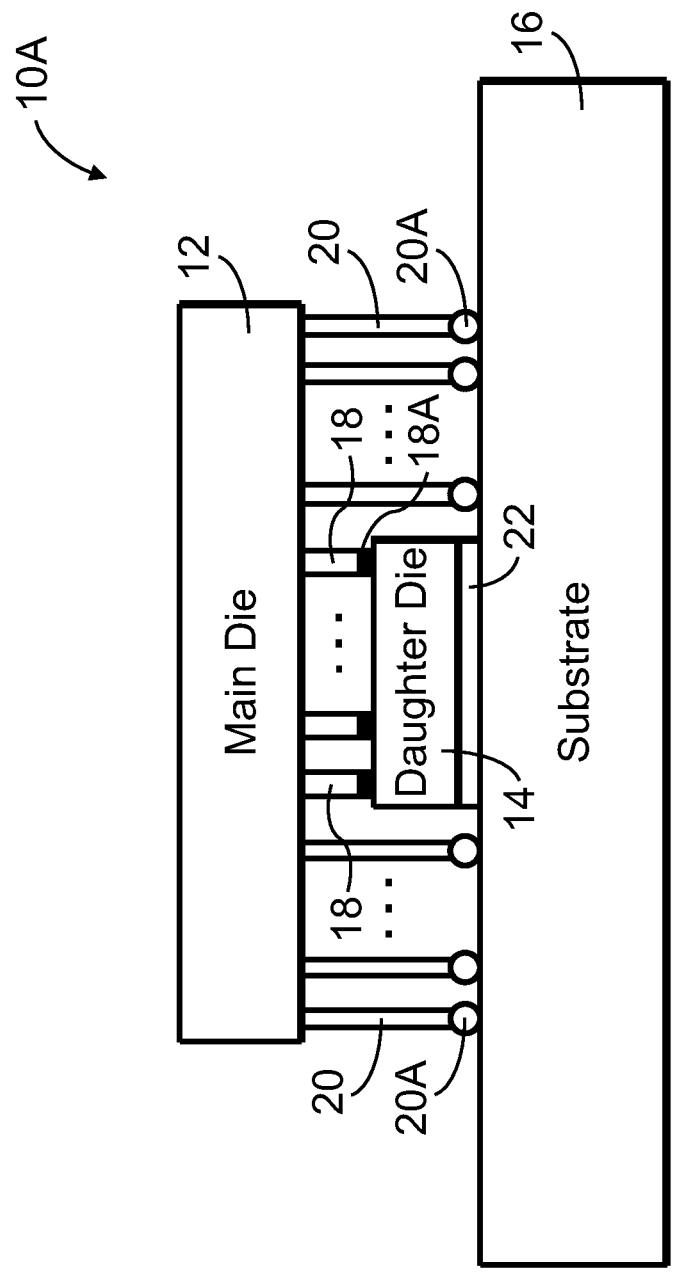
FIG. 1 illustrates an arrangement of various elements or components in an interconnect mechanism according to an exemplary embodiment.

Referring to FIG. 1, an arrangement 10A of various elements in an interconnect mechanism according to an exemplary embodiment is illustrated. Arrangement 10A includes main die 12 (or mother die, or large device die, or Die 1), a smaller die 14 (or daughter die, or small device die, or Die 2), and substrate 16. Die 14 is mounted or arranged above or over substrate 16.

Main die 12 is the typically larger die with multilevel copper pillars. There are at least two different heights of interconnects, in this case at least two different heights of copper pillars.

First, there are shorter copper (Cu) pillars 18 (alternatively, microbumps may be used depending on relative dimension). Copper pillars 18 may be used for the electrical interconnections for connecting two die faces. As an example, copper pillars 18 may provide a coupling mechanism between a face of die 12 and a face of die 14, as FIG. 1 shows. At the point of coupling or attachment of copper pillars 18 to die 14, tinned lands or areas 18A may be used.

In exemplary embodiments, copper pillars 18 may have desired heights, for instance a few microns at finer pitches to larger heights at coarser pitches (e.g., about 10 microns diameter on 20 micron pitch to about 25 micron diameter on 50 micron pitch as non-limiting examples). The dimensions, pitch, and numbers of the interconnect, such as copper pillars 18, may be different in other embodiments, as persons of ordinary skill in the art understand. For example, they can be larger or smaller, as desired.

In some embodiments, coppers pillars 18 are processed or fabricated on die 12. Persons of ordinary skill in the art understand that it is also possible to have copper pillars processed on the smaller die, i.e., die 14. In other words, the larger copper pillars 20 (described below in detail) may be fabricated on die 12 and the smaller copper pillars 18, or microbumps, can be fabricated on die 14. Persons of ordinary skill in the art understand that there may be other numbers, types, configurations, placements, fabrications, and/or sizes of interconnects (e.g., copper pillars), depending on various factors, such as the total number of die, size of die, etc., in an assembly or package.

A second set of copper pillars 20 are also used in arrangement 10A. Copper pillars 20 may be taller than copper pillars 18. In exemplary embodiments, the second set, copper pillars 20, may have larger diameter/pitch than the first set. In exemplary embodiments, the second set of copper pillars 20 are used to connect, bond, or couple die 12 to the next level of package, for example, to an organic package substrate 16.

At the point of coupling or attachment of copper pillars 20 to substrate 16, microbumps or tinned lands or areas 20A may be used. Microbumps 20A in exemplary embodiments may have a height of 35 to 50 microns, although other heights may be used, as persons of ordinary skill in the art understand.

The height, pitch, spacing, number, and configuration of copper pillars 20 depends on the particular specifications or desired features for a given implementation, as persons of ordinary skill in the art understand. In exemplary embodiments, the heights of copper pillars 20 may be about 100 microns to 250 microns, with diameters from about 50 microns to about 250 microns, commensurate with the height.

Die 12 and die 14 may be interconnected using a number of techniques, as described below in detail. In some embodiments, after die 12 and die 14 are interconnected (e.g., using copper pillars 18), the stack (or assembly or partial assembly) may be turned over and mounted onto the package substrate. In exemplary embodiments, copper pillars 20 and solder (e.g., microbumps or tinned lands or areas 20A) may be used to perform the mounting. In exemplary embodiments, solder may generally be used as a gluing material and may also be used to increase the interconnect height, as desired.

In exemplary embodiments, such as the embodiment in FIG. 1, the space between the components, for example, between die 14 and the package or substrate 16, may be filled with an appropriate underfill 22. Underfill 22 may reside in or fill the space between die 14 and substrate 16. Underfill 22 may increase the reliability of the interconnect joints between the die (e.g., die 14) and the organic package substrate 16.

As persons of ordinary skill in the art understand, additional or other dimensions are possible and may be used as well in other embodiments. For example, depending on factors such as the height of die 14 in a given implementation, the heights may be taller or shorter than the examples provided above.

In some embodiments, additional die may be disposed as part of the arrangement, and interconnects provided between a desired set of the die. For example, a third die may be used in an assembly or package. In such embodiments, a third set of interconnect (e.g., copper pillars or other suitable interconnect or coupling mechanism) of intermediate height (between the respective heights of copper pillars 18 and copper pillars 20) may be optionally used to accommodate three die and serve as interconnect.

Figure 2:
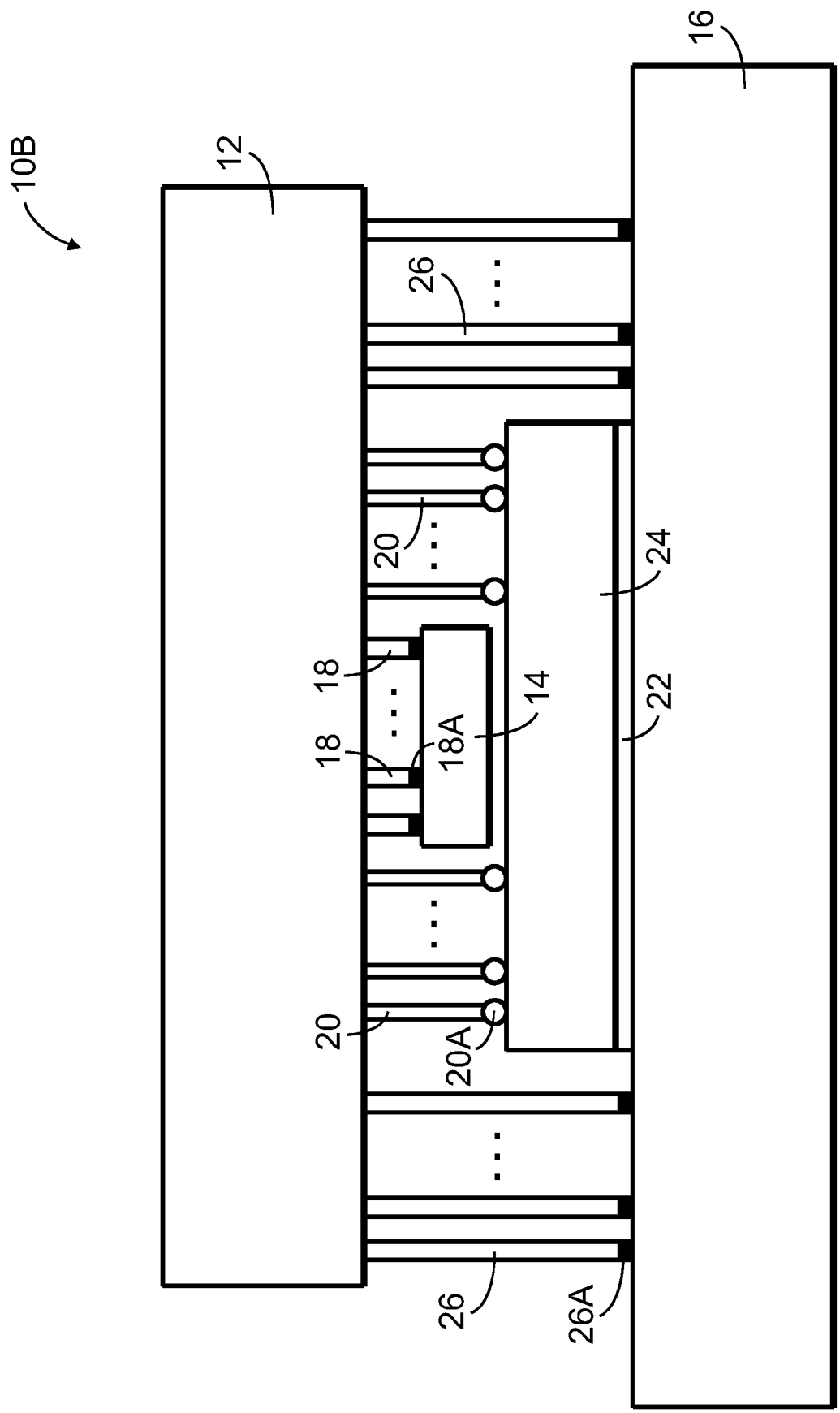
FIG. 2 depicts an arrangement of various elements or components in an interconnect mechanism according to another exemplary embodiment.

FIG. 2 shows an arrangement 10B of various elements in an interconnect mechanism according to an exemplary embodiment. Arrangement 10B includes three die, one larger than the other two die, one intermediate-size die, and one die that is smaller than the other two. The die are labeled as die 12, die 24 (or intermediate or daughter die), and die 14.

In the embodiment shown in FIG. 2, die 24 resides or is disposed or located between die 12 and die 14. Copper pillars 18 and copper pillars 20 provide an interconnect or coupling mechanism to couple, die 12 to die 14, and die 14 to die 24, respectively, as described above in detail. In exemplary embodiments, such as the embodiment shown in FIG. 2, if used, a third set of copper pillars 26 may be used to accommodate face to face attachment or coupling of an additional type of die.

Thus, the embodiment shown in FIG. 2 uses copper pillars 18 and copper pillars 20 provide an interconnect or coupling mechanism between die 12 and die 14, and die 14 and die 24, respectively. In addition, copper pillars 26 provide an interconnect or coupling mechanism between die 12 and substrate 16.

In the embodiment shown in FIG. 2, die 14 and die 24 are assumed to have thicknesses of approximately 50 and 75 microns, respectively. In addition, copper pillars 18 have a height of approximately 15 microns. Copper pillars 20 have height, diameter, and pitch of 100 microns, 50 microns, and 100 microns, respectively. Copper pillars 26 have height, diameter, and pitch of 250 microns, 150 microns, and 250 microns, respectively.

At the point of coupling or attachment of copper pillars 26 to substrate 16, tinned lands or areas (or alternatively microbumps) 26A may be used. In addition, at the point of coupling or attachment of copper pillars 20 to die 24, microbumps or tinned lands or areas 20A may be used. Microbumps 20A in exemplary embodiments may have a height of approximately 10 microns.

In exemplary embodiments, such as the embodiment in FIG. 2, the space between the components, for example, between die 24 and the package or substrate 16, may be filled with an appropriate underfill 22. Underfill 22 may reside in or fill the space between die 24 and substrate 16. Underfill 22 may increase the reliability of the interconnect joints between the die (e.g., die 24) and the organic package substrate 16.

Generally, the interconnection structure in exemplary embodiments may have the following features and components. Interconnect between a larger die to a smaller die may be provided using the smallest (or a relatively small) copper pillar or microbumps. The smaller die is relatively thin, but thick enough to make the handling of the die and the assembly relatively easy and practical. Typically, a thickness of 100 microns may be used, although, as persons of ordinary skill in the art understand, other thicknesses may be used in other embodiments, depending on factors such as semiconductors and technology used, etc. These attributes apply to configurations or packages or assemblies that include two or three die.

If thinner (or thicker) die may be properly supported or handled by a given technology, the interconnect architecture may be adapted to such die in exemplary embodiments. In exemplary embodiments, the smaller die may be made thicker, depending on the height of the copper pillars that interconnect or couple the larger die to the substrate.

For example, in one exemplary embodiment, the taller copper pillars of 150 micron height may support a die thickness (for the smaller die) of about 115 micron. In another exemplary embodiment, the taller copper pillars of 250 micron height may support a die thickness (for the smaller die) of about 215 microns. In yet another exemplary embodiment, a thickness (for the smaller die) of about 50 microns may be supported by copper pillar heights of about 85 microns to about 100 microns.

As persons of ordinary skill in the art understand, the dimensions described in the disclosure merely represent examples, and not limiting values. Other dimensions, such as die thickness, pillar height, diameter, and pitch may be used, depending on factors such as the specifications of a given or desired implementation.

The disclosed concepts provide many advantages. They provide techniques for face to face bonding of two die with relatively high interconnect density, as both microbumps and tall copper pillars are area array connections. Further, a face to face interconnect stack using flip chip approach for the large or larger die to package or substrate is provided, which allows improved high frequency electrical performance.

As another advantage, the multilevel copper pillar architecture provides even a higher I/O density than the conventional solder option. (Solder bumps are spherical, and their processing may limit the pitch of the interconnects therefore limiting the density.) Relatively tall copper pillars are cylindrical and therefore can provide a relatively high aspect ratio height to diameter.

The multilevel copper pillar architecture also supports a wide variety of solder bumps, microbumps, etc. The diameter to height of such elements in exemplary embodiments may be about 2:1 (i.e., diameter is 2 units, height is 1 unit), and for copper pillars about 0.5:1 (diameter to height). Copper pillar may be in some cases four times smaller diameter (than solder), and can therefore provide more I/Os compared to solder bumps. Additionally, solder processing using plating and screen printing (lower cost processes) may use more space than the diameter, therefore further reducing I/O density compared to the Cu pillar, which has no such restriction.

As yet another advantage, copper pillars may be processed to provide taller heights than the solder bumps for the same pillar/solder diameter. The taller interconnect helps to keep manageable or reduce the thickness of a smaller or daughter thickness (say, around 100 microns), as the smaller or daughter die fits or resides within the Z-space between the a larger die and the package substrate.

Improved or optimum conditions for flip chip interconnecting of a face to face stack (with microbumps) on a package substrate entails providing enough Z-space so that a smaller or daughter die, with a thickness appropriate or suitable for handling, for example, about 100 microns, may be fit between a larger die and the package substrate. For a smaller or daughter die having 100 micron thickness, this height may be larger than about 135 microns. Such heights may be achieved or accommodated using copper pillars according to exemplary embodiments.

An additional advantage relates to the processing of the copper pillars and microbumps, compared to the processing of microbumps and solder bumps (C4). Specifically, the processing of the multilevel copper pillars can be accomplished using the same copper metal and under pillar metallurgy. If, however, one uses solder interconnect, dissimilar metals (solder, copper microbumps/pillar) may be processed using different equipment.

The disclosed techniques and apparatus provide a flexible mechanism for providing electrical coupling or interconnects among the die and the substrate. Consequently, electronic circuitry packaged or assembled according to the disclosed techniques may be used to form complex circuitry or systems.

For example, in two-die embodiments (see, for example, FIG. 1), die 12 may be coupled electrically to die 14 (using copper pillars 18) and/or to substrate 16 (using copper pillars 20). Die 14 may further be coupled to substrate 16 via die 12 (using copper pillars 18 and copper pillars 20).

Figure 3:
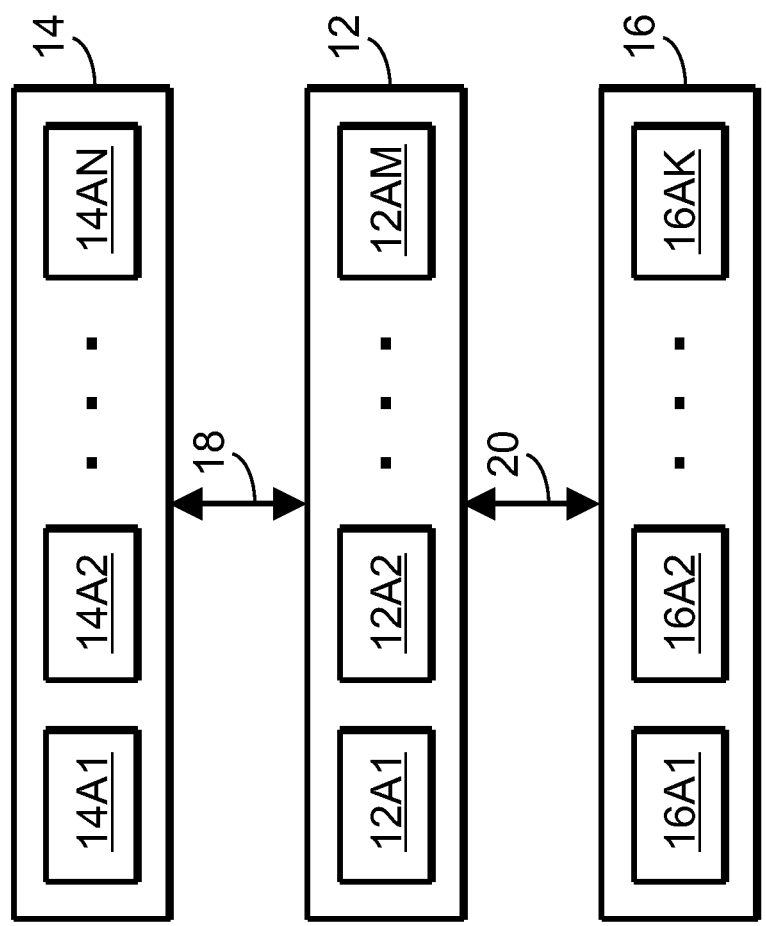
FIG. 3 shows a block diagram of electrical interconnections among circuitry in an assembly according to an exemplary embodiment.

FIG. 3 shows a block diagram of electrical interconnections among circuitry in an assembly according to an exemplary embodiment. The N blocks of circuitry in die 14 are labeled as blocks 14A1-14AN, where N denotes a positive integer. Similarly, the M blocks of circuitry in die 12 are labeled as blocks 12A1-12AM, where M denotes a positive integer. Finally, the K blocks of circuitry in substrate 16 are labeled as blocks 16A1-16AM, where K denotes a positive integer. (The integers N, M, and K may or may not be equal, as desired, or as might be the case for a given implementation or embodiment.)

Copper pillars 18 act as an interconnect or coupling mechanism to couple one or more of blocks of circuitry 14A1-14AN to one or more of blocks of circuitry 12A1-12AM. Similarly, copper pillars 20 act as an interconnect or coupling mechanism to couple one or more of blocks of circuitry 12A1-12AM to one or more of blocks of circuitry 16A1-16AK. In some embodiments, some of copper pillars 18 and some of copper pillars 20 may be used to provide an interconnect or coupling mechanism to couple one or more of blocks of circuitry 14A1-14AN to one or more of blocks of circuitry 16A1-16AK via die 12 (or via one or more of blocks of circuitry 12A1-12AM).

As another example, in three-die embodiments (see, for example, FIG. 2), die 12 may be coupled electrically to die 14 (using copper pillars 18), to die 24 (using copper pillars 20) and/or to substrate 16 (using copper pillars 26). Die 14 may be coupled to substrate 16 via die 12 (using copper pillars 18 and copper pillars 26). Die 24 may be coupled to substrate 16 via die 12 (using copper pillars 20 and copper pillars 26).

Figure 4:
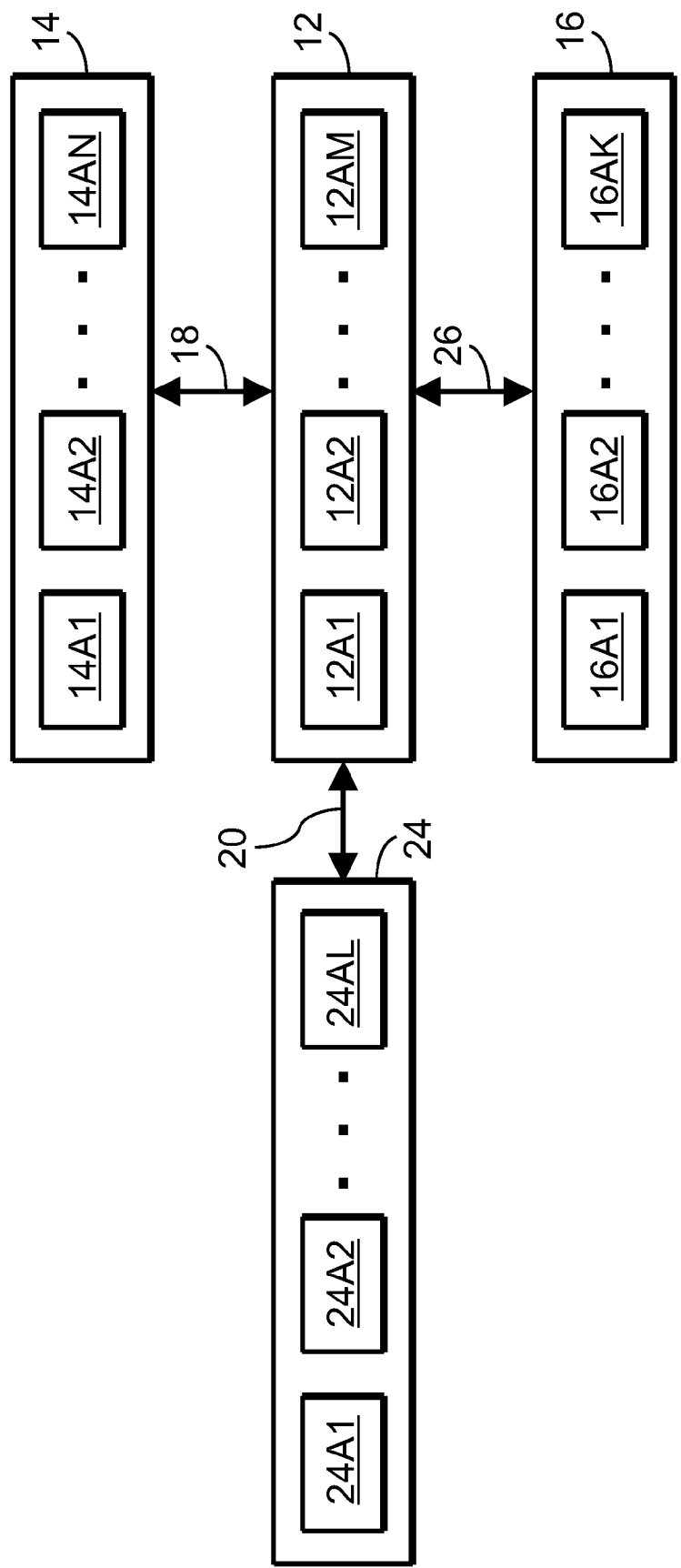
FIG. 4 depicts a block diagram of electrical interconnections among circuitry in an assembly according to another exemplary embodiment.

FIG. 4 shows a block diagram of electrical interconnections among circuitry in an assembly according to an exemplary embodiment. The N blocks of circuitry in die 14 are labeled as blocks 14A1-14AN, where N denotes a positive integer. Similarly, the M blocks of circuitry in die 12 are labeled as blocks 12A1-12AM, where M denotes a positive integer. The L blocks of circuitry in die 24 are labeled as blocks 24A1-34AL, where L denotes a positive integer. Finally, the K blocks of circuitry in substrate 16 are labeled as blocks 16A1-16AM, where K denotes a positive integer. (The integers N, M, L, and K may or may not be equal, as desired, or as might be the case for a given implementation or embodiment.)

Copper pillars 18 act as an interconnect or coupling mechanism to couple one or more of blocks of circuitry 14A1-14AN to one or more of blocks of circuitry 12A1-12AM. Similarly, copper pillars 20 act as an interconnect or coupling mechanism to couple one or more of blocks of circuitry 24A1-24AL to one or more of blocks of circuitry 12A1-12AM. Copper pillars 26 act as an interconnect or coupling mechanism to couple one or more of blocks of circuitry 12A1-12AM to one or more of blocks of circuitry 16A1-16AK.

In some embodiments, some of copper pillars 18 and some of copper pillars 26 may be used to provide an interconnect or coupling mechanism to couple one or more of blocks of circuitry 14A1-14AN to one or more of blocks of circuitry 16A1-16AK via die 12 (or via one or more of blocks of circuitry 12A1-12AM). Furthermore, in some embodiments, some of copper pillars 18 and some of copper pillars 20 may be used to provide an interconnect or coupling mechanism to couple one or more of blocks of circuitry 14A1-14AN to one or more of blocks of circuitry 24A1-24AL. In addition, in some embodiments, some of copper pillars 20 and some of copper pillars 26 may be used to provide an interconnect or coupling mechanism to couple one or more of blocks of circuitry 24A1-24AL to one or more of blocks of circuitry 16A1-16AK via die 12 (or via one or more of blocks of circuitry 12A1-12AM).

The die 12, 14, and 24 (if used) in exemplary embodiments may have a wide variety of circuitry included or fabricated in or on them, as persons of ordinary skill in the art understand. For instance, one stacked die may include digital circuitry, whereas another stacked die may include analog circuitry.

Figure 5:
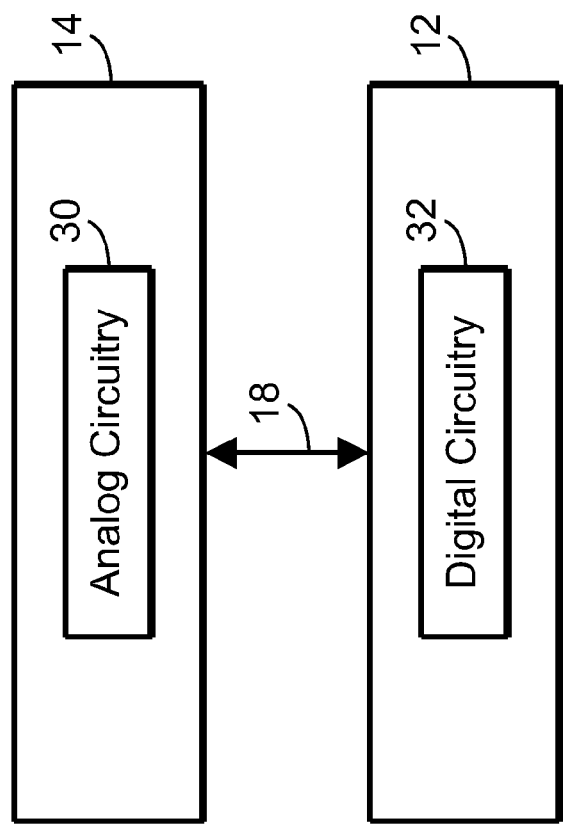
FIG. 5 illustrates including various types of circuitry in semiconductor die according to an exemplary embodiment.

FIG. 5 shows an example of partitioning circuitry in this manner. Specifically, in the embodiment shown, die 12 includes digital circuitry 32, whereas die 14 includes analog circuitry 30. Copper pillars 18 provide an interconnect or coupling mechanism between the circuitry in die 12 and the circuitry in die 14, for instance, between analog circuitry 30 and digital circuitry 32.

Generally, digital circuitry generates more noise or interference by virtue of the switching in digital circuits. Conversely, analog circuitry may have more sensitivity to noise. By including the two types of circuitry in two physically distinct die, interference or the effects of interference in analog circuitry 30 may be reduced or eliminated.

Figure 6:
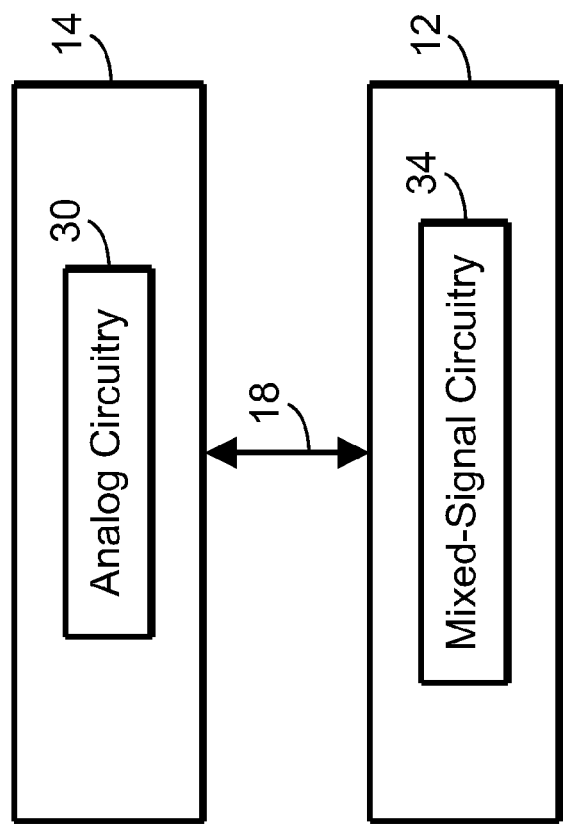
FIG. 6 depicts including various types of circuitry in semiconductor die according to another exemplary embodiment.

In another embodiment, one die may include analog or digital circuitry, whereas another die may include mixed-mode circuitry (or both die may include the same type of circuitry). FIG. 6 shows an example of partitioning circuitry where one die includes analog circuitry, and another die includes mixed-signal circuitry.

Specifically, in the embodiment shown, die 12 includes mixed-signal circuitry 34, whereas die 14 includes analog circuitry 30. Copper pillars 18 provide an interconnect or coupling mechanism between the circuitry in die 12 and the circuitry in die 14, for instance, between analog circuitry 30 and mixed-signal circuitry 34.

Mixed-signal circuitry 34 by its nature generates or receives or operates on analog and digital signals (or includes digital circuitry). As noted above, generally, digital signals or circuits generate more noise or interference. Conversely, analog circuitry may have more sensitivity to noise. By including the two types of circuitry in two physically distinct die, interference or the effects of interference in analog circuitry 30 may be reduced or eliminated.

As another example, one stacked die may include circuitry realized using a silicon-based technology, whereas another stacked die may include circuitry realized using another semiconductor, such as gallium arsenide (GaAs), silicon germanium (SiGe), and the like. Allowing the interconnection of die including circuitry realized using different technologies provides for more flexibility in designing, building, and packaging electronic circuits and systems.

As yet another example, one die may include circuitry realized using a fabrication technology with a particular feature size (e.g., 90 nm), whereas another stacked die may include circuitry realized using a fabrication technology with a different feature size (e.g., 45 nm). Using these techniques, a flexible way for providing functionality in a variety of semiconductor technologies may be provided.

As noted, in some embodiments, more than two die may be stacked, for example, three die. Such embodiments provide for increased flexibility of the type and configuration of electrical circuitry that may be used. For instance, one stacked die may include digital circuitry, whereas another stacked die may include analog circuitry. As another example, one stacked die may include circuitry realized using a silicon-based technology, whereas another stacked die may include circuitry realized using another semiconductor, such as gallium arsenide (GaAs), silicon germanium (SiGe), and the like.

As yet another example, one die may include circuitry realized using a fabrication technology with a particular feature size (e.g., 90 nm), whereas another stacked die may include circuitry realized using a fabrication technology with a different feature size (e.g., 45 nm). Using these techniques, a flexible way for providing functionality in a variety of semiconductor technologies may be provided.

Regardless of the number of die used, in some embodiments, circuitry implemented using the stacked die may provide different or complementary functionality. For example, one stacked die (e.g., die 14 in FIG. 1) may include application specific IC (ASIC) circuitry, system on a chip (SoC), and the like, whereas another stacked die (e.g., die 12 in FIG. 1) may include FPGA circuitry. In this manner, the ASIC (or SoC) can provide some parts of the overall system functions with lower area and power dissipation overhead (albeit with less flexibility), whereas the FPGA provide other parts of the overall system function with increased flexibility, programmability or configurability.

Broadly speaking, any of the die may include any desired type of circuitry that provides functionality suitable, desired, or appropriate for a given implementation or use. Thus, although some of the die may include FPGA circuitry in some embodiments, those embodiments are merely illustrative, without loss of generality.

Generally, one or more of the die may include a variety of types of circuitry, such as programmable, non-programmable, digital, analog, mixed-signal, hard-coded, standard cells, and the like, as persons of ordinary skill in the art understand. The circuitry may include various components or blocks, such as passive components (capacitors, inductors, resistors), active components (transistors, diodes, etc.), gates, amplifiers, comparators, memory, signal processing circuitry (both analog and digital), signal conversion circuitry (e.g., analog to digital converters, digital to analog converters), processors, I/O circuits, timers, multiplexers, demultiplexers, encoders, decoders, drivers, counters, transmitters, receivers, transceivers, test and debug circuits, etc., as persons of ordinary skill in the art understand.

Figure 7:
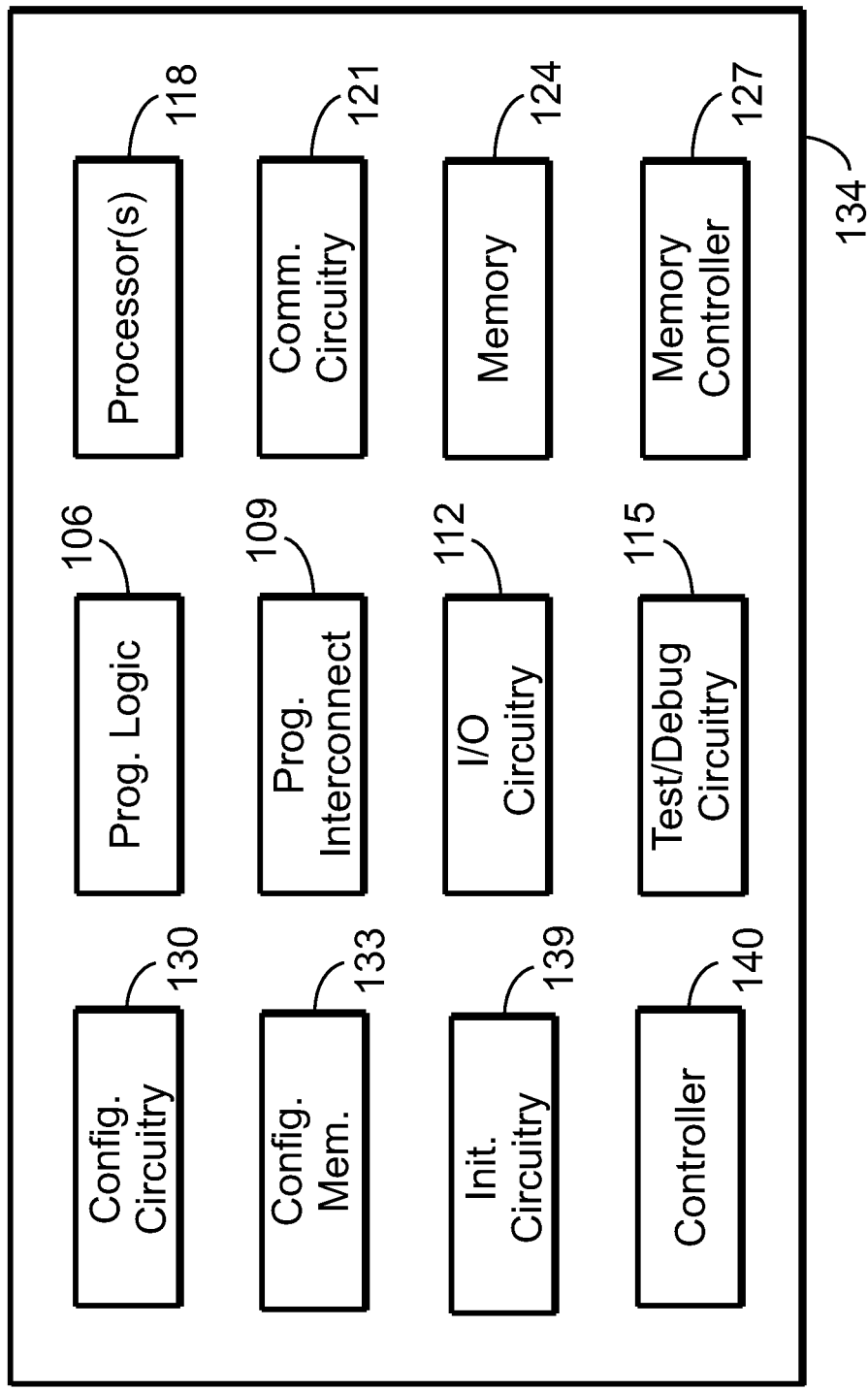
FIG. 7 illustrates a block diagram of a field programmable gate array (FPGA) that may be included in one or more die in exemplary embodiments.

Without loss of generality, in some embodiments, one or more of the stacked die may include FPGA circuitry, as noted above. FIG. 7 illustrates a general block diagram of an FPGA 134 that may be used in such embodiments.

FPGA 134 includes configuration circuitry 130, configuration memory (CRAM) 133, controller 140, programmable logic 106, programmable interconnect 109, and I/O circuitry 112. In addition, FPGA 134 may include test/debug circuitry 115, one or more processors 118, one or more communication circuitry 121, one or more memories 124, one or more controllers 127, and initialization circuit 139, as desired. In some embodiments, FPGA 134 may also include one or more voltage regulators or power supply circuits (not shown).

Note that the figure shows a general block diagram of FPGA 134. Thus, FPGA 134 may include other blocks and circuitry, as persons of ordinary skill in the art understand. Examples of such circuitry include clock generation and distribution circuits, and the like. Furthermore, FPGA 134 may include analog circuitry, other digital circuitry, and/or mixed-signal circuitry, fuses, anti-fuses, and the like, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 134 (for example, by using pass gates and/or MUXs). In some embodiments, programmable logic 106 and/or programmable interconnect 109 may include fuses and/or anti-fuses to provide additional flexibility or programmability.

Initialization circuit 139 may cause the performance of various functions at reset or power-up of FPGA 134. At or after power-up, FPGA 134 obtains configuration information, typically from an external device. Based on the configuration information, various blocks or devices within the FPGA core or fabric, or other blocks or resources in FPGA 134, are configured or programmed. Examples include programmable logic 106 and programmable interconnect 109.

Part of the circuitry in programmable interconnect 109 may be used to realize one or more interconnects with other die in a stacked-die device.

Referring to FIG. 7, I/O circuitry 112 may constitute a wide variety of I/O devices or circuits. I/O circuitry 112 may couple to various parts of FPGA 134, for example, programmable logic 106 and programmable interconnect 109. I/O circuitry 112 provides a mechanism and circuitry for various blocks within FPGA 134 to communicate with external circuitry or devices, such as other die in a device, as desired.

Test/debug circuitry 115 facilitates the testing and troubleshooting of various blocks and circuits within FPGA 134. Test/debug circuitry 115 may include a variety of blocks or circuits known to persons of ordinary skill in the art. For example, test/debug circuitry 115 may include circuits for performing tests after FPGA 134 powers up or resets, as desired. Test/debug circuitry 115 may also include coding and parity circuits, as desired.

FPGA 134 may include one or more processors 118. Processor 118 may couple to other blocks and circuits within FPGA 134. Processor 118 may receive data and information from circuits within or external to FPGA 134 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired. Processor(s) 118 may operate in cooperation with circuitry included in other die within a stacked-die device, for example, ASIC circuitry included in a die.

FPGA 134 may also include one or more communication circuit(s) 121. Communication circuit(s) 121 may facilitate data and information exchange between various circuits within FPGA 134 and circuits external to FPGA 134, as persons of ordinary skill in the art understand. Examples of communication circuit 121 include transceivers, network interface circuits, etc.

FPGA 134 may further include one or more memories 124 and one or more memory controller(s) 127. Memory 124 allows the storage of various data and information (such as user-data, intermediate results, calculation results, etc.) within FPGA 134. Memory 124 may have a granular or block form, as desired. Similar to processor(s) 118, memory 124 may operate in cooperation with circuitry included in other die within a stacked-die device, for example, ASIC circuitry included in a die.

Memory controller 127 allows interfacing to, and controlling the operation and various functions of, circuitry outside the FPGA. For example, memory controller 127 may interface to and control an external synchronous dynamic random access memory (SDRAM). The external SDRAM may be located in other die within a stacked-die device, for example, ASIC circuitry included in a die.

By using the various resources of FPGA 134, together with circuitry included in other die in a stacked die device, a wide variety of functions, such as entire systems, may be realized. Such systems may operate in cooperation with (or include) sensors, transducers, input/output devices (e.g., displays, keyboards), and the like. Furthermore, such systems may produce, process, or provide a wide variety of signals and types of signals, such as analog, digital, and mixed-signal.

In some embodiments, it might be desirable to interface FPGA 134 to circuitry integrated or fabricated externally to FPGA 134, rather than within it. Reasons for such partitioning of circuitry or system blocks may include cost reduction, ease of fabrication, ease of integration, accommodation of differing integration or fabrication technologies, interference mitigation, etc.

In some embodiments, one may include and interface with FPGA 134 Intellectual Property (IP) blocks or generally other block(s) of circuitry. Examples include transceivers; memory; memory controllers; processors, including DSPs, microcontrollers, and microprocessors; etc. For instance, one may obtain or fabricate a die with a processor included, and interface that die to a die that includes FPGA 134, rather than include the processor in the same die as FPGA 134 (e.g., referring to FIG. 7, move processor(s) 118 to another die).

Figure 8:
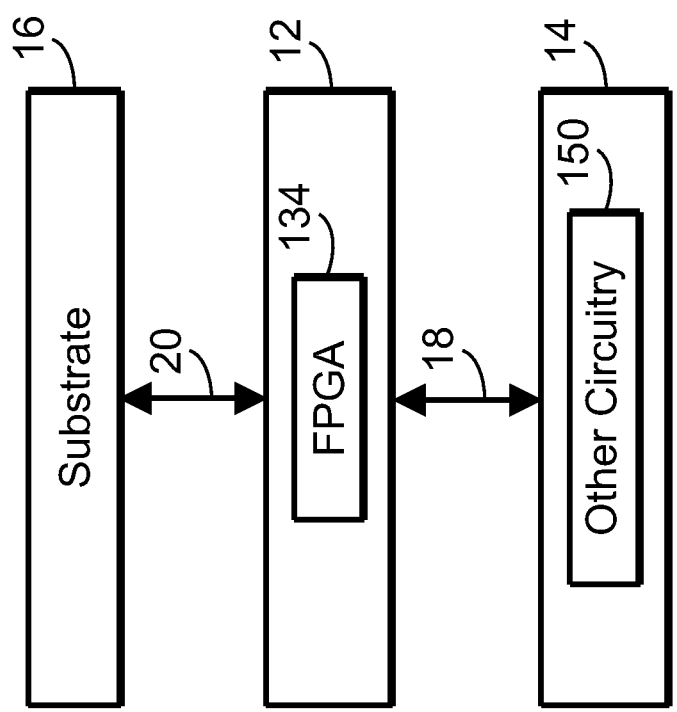
FIG. 8 shows a block diagram of a circuit arrangement for coupling an FPGA to other circuitry according to an exemplary embodiment.

In some exemplary embodiments, circuitry for FPGA 134 may reside in one die, for example, die 12, and the other block(s) of circuitry (labeled as "other circuitry") 150, such as IP blocks, may reside in another die, such as die 14. FIG. 8 illustrates a block diagram of such an arrangement according to an exemplary embodiment. Copper pillars 18 provide an interconnect or coupling mechanism between die 12 generally, and FPGA 134 in particular, and die 14, and in particular other block(s) of circuitry 150.

Copper pillars 20 provide an interconnect or coupling mechanism between die 12 and substrate 16, as described above. Note that through copper pillars 18 and copper pillars 20, other block(s) of circuitry 150 may couple to substrate 16 or circuitry included within it, as described above. In some embodiments, FPGA 134 may be included in die 14, and other block(s) of circuitry 150 in die 12, as desired. In some embodiments, other block(s) of circuitry 150 may be included in substrate 16, in die 14, or both, as desired. Other variations (e.g., partitioning other block(s) of circuitry 150 between die 14 and substrate 16) are possible, as persons of ordinary skill in the art understand.

Figure 9:
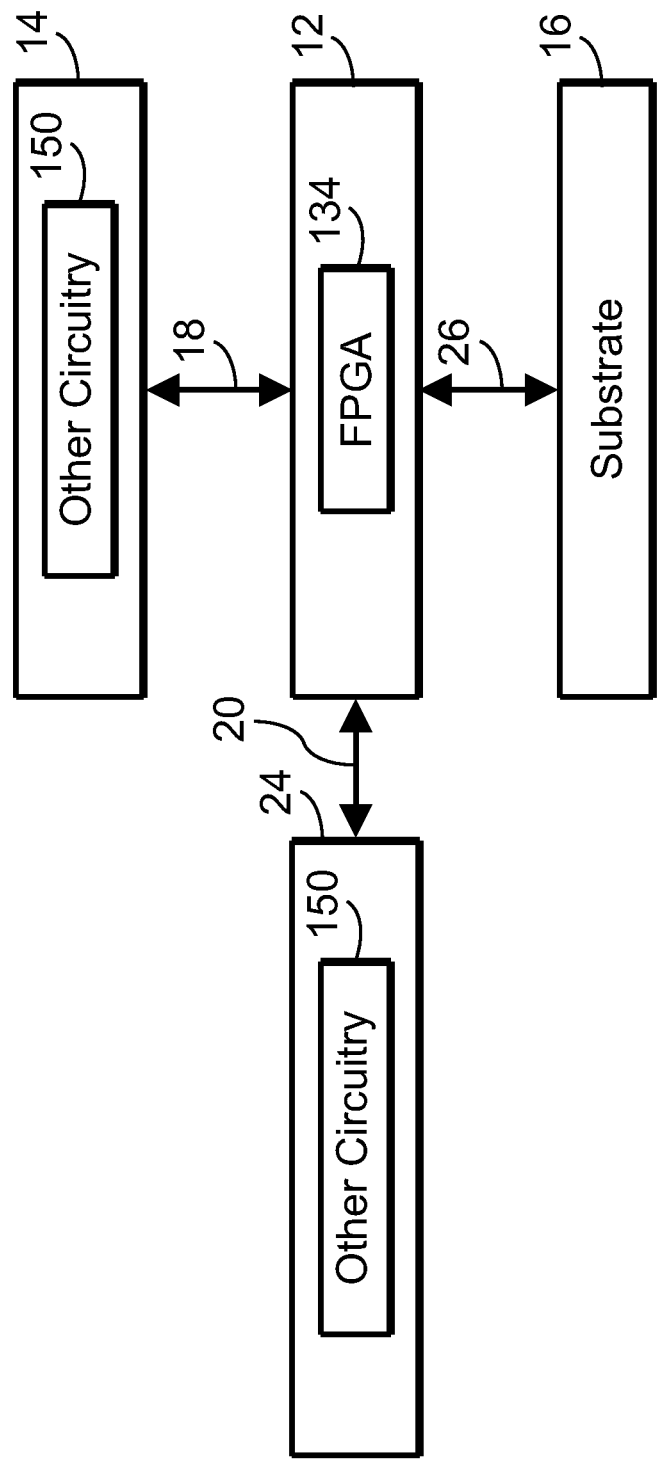
FIG. 9 illustrates a block diagram of a circuit arrangement for coupling an FPGA to other circuitry according to another exemplary embodiment.

A similar technique may be applied to embodiments that include three die. FIG. 9 depicts a block diagram of such an arrangement according to an exemplary embodiment. In the embodiment shown, circuitry for FPGA 134 may reside in one die, for example, die 12, and the other block(s) of circuitry (labeled as "other circuitry") 150, such as IP blocks, may reside in one or more other die, such as die 14 and/or die 24.

Copper pillars 18 provide an interconnect or coupling mechanism between die 12 generally, and FPGA 134 in particular, and die 14, and in particular other block(s) of circuitry 150 (if such blocks of circuitry are included in die 14). Copper pillars 20 provide an interconnect or coupling mechanism between die 12 generally, and FPGA 134 in particular, and die 24, and in particular other block(s) of circuitry 150 (if such blocks of circuitry are included in die 24).

Copper pillars 26 provide an interconnect or coupling mechanism between die 12 and substrate 16, as described above. Note that, through copper pillars 18 and copper pillars 26, other block(s) of circuitry 150, if included in die 14, may couple to substrate 16 or circuitry included within it, as described above. Furthermore, through copper pillars 20 and copper pillars 26, other block(s) of circuitry 150, if included in die 24, may couple to substrate 16 or circuitry included within it, as described above.

In some embodiments, FPGA 134 may be included in die 14, and other block(s) of circuitry 150 in die 12 or, alternatively, FPGA 134 may be included in die 24, and other block(s) of circuitry 150 in die 12, as desired. In some embodiments, other block(s) of circuitry 150 may be included in substrate 16, in die 14, and/or die 24, as desired. Other variations (for example, partitioning other block(s) of circuitry 150 between two or more of die 14, die 24, and substrate 16) are possible, as persons of ordinary skill in the art understand.

One aspect of the disclosure relates to techniques for processing and fabrication techniques to provide the disclosed interconnect structures and related assemblies or packages. The following description provides details of various techniques and several flows to create multilevel copper pillars, face to face stack assemblies, packages, etc.

In exemplary embodiments, various fabrication or processing flows may be employed. The flows described below constitute merely examples, and are not limiting or an exhaustive list of flows that one may use, depending on circumstances such as process availability, specifications, target cost, etc. As persons of ordinary skill in the art understand, other flows may be used, or the described flows may be modified, as desired.

FIG. 10 shows a table that summarizes a number of exemplary flows. Note that FIG. 10 shows the features and attributes of flows that may be applied to assemblies or packages that include two die (e.g., die 12 (large device die) and die 14 (small device die) in FIG. 1) and two heights of copper pillars (e.g., copper pillars 20 (tall pillar) and copper pillars 18 (short pillar/microbump) in FIG. 1). As persons of ordinary skill in the art understand, however, the flows may be modified (e.g., some process steps repeated for additional die) and used to fabricate three-die or generally multi-die assemblies or packages, as desired.

Referring to FIG. 10, the table provides an indication of how or in what manner various features are fabricated, located, etc. For example, for flow 1, tall copper pillars 20 may be fabricated on die 12. Short copper pillars 18 (or microbumps) may also be fabricated on die 12. Standard pads may be used on die 14 and substrate 16 to effect the interconnections or coupling mechanisms.

Figure 12:
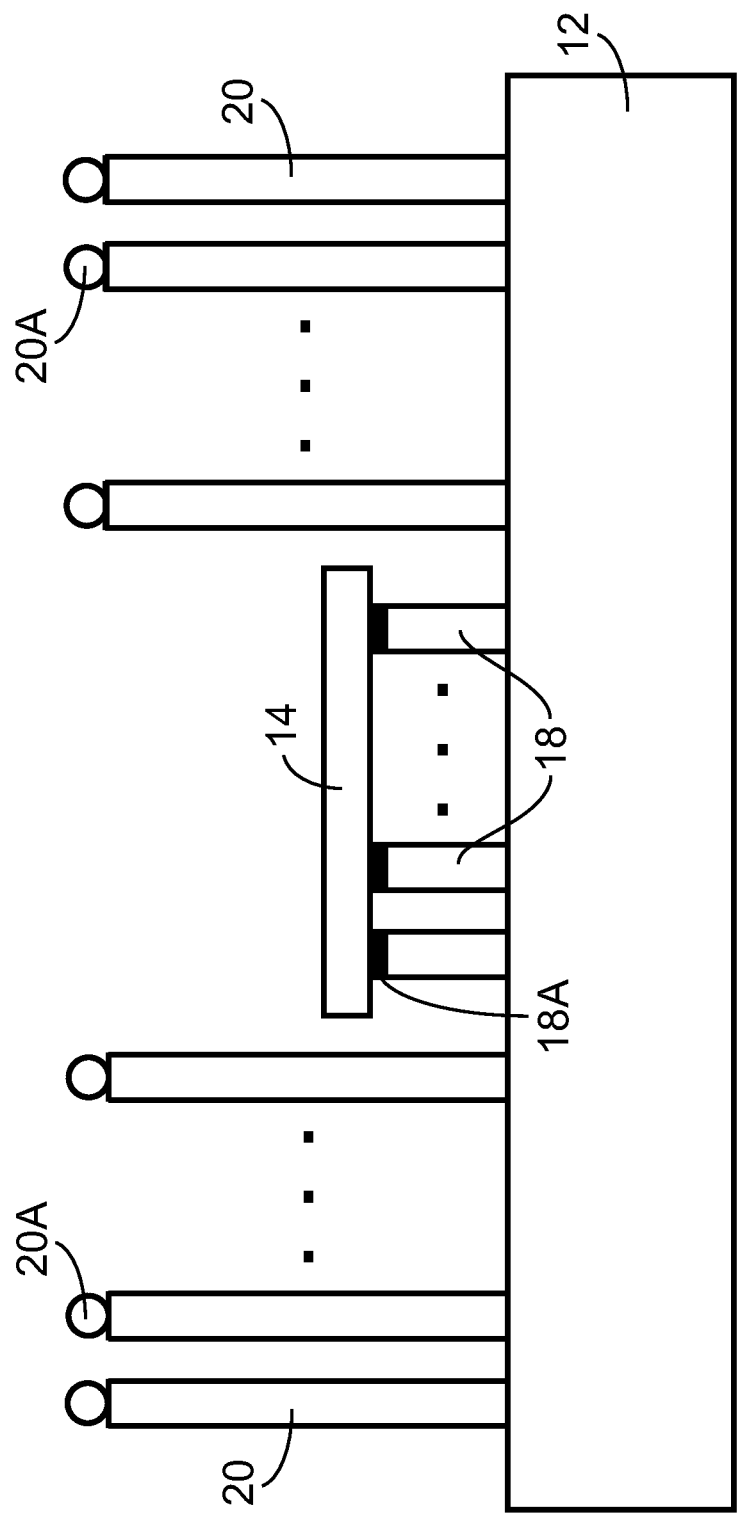
FIG. 12 illustrates additional steps in fabrication or assembly of structures according to the embodiment of FIG. 11.

Once copper pillars 20 and copper pillars 18 are fabricated on die 12, die 14 is mounted face to face with die 12. The assembly is then turned over, and assembled or mounted onto package substrate 16, for example, using flip chip assembly techniques. FIGS. 11-12 illustrate the various steps. Existing fabrication or processing techniques may be used in exemplary embodiments, as desired.

Referring to FIG. 11, copper pillars 18 are fabricated on die 12. In addition, copper pillars 20 are also fabricated on die 12. The lands or ends of copper pillars 18 or 20 may be tinned, and microbumps, if used, may be fabricated.

Referring to FIG. 12, die 14 is mounted to or assembled onto copper pillars 18. As persons of ordinary skill in the art understand, various chip on wafer assembly, bonding, or mounting techniques may be used to assemble die 14 to copper pillars 18. In exemplary embodiments, thermo-compression (TC) bonding may be used to bond or mount die 14 on copper pillars 18.

If multiple assemblies of die 14 on die 12 were fabricated, die 12 may be diced. Subsequently, the assembly of die 12 and die 14 is turned or flipped over, and mounted to substrate 16 using, for example, flip chip assembly techniques. The resulting structure or assembly or package may be as shown in FIG. 1 (or FIG. 2, if more than two die are used). In exemplary embodiments, lands of substrate 16 or locations where copper pillars 20 interconnect to substrate 16, may have printed solder or solder bumps to facilitate the assembly.

An advantage of flow 1 is that the process to create copper microbumps may be used in exemplary embodiments to create taller bumps by using fabrication techniques such as photolithography, for example, by using an additional photoresist step. The photoresist may be sufficiently thick dry resist to allow for taller heights. With pillar metallurgy, top metal pad (Sn (tin), for example) will be the same or similar to copper microbumps. Because the same chemistry and process line may be used, cost savings may be realized relative to creating microbumps with copper but creating taller pillars with solder (even not taking into account the spherical nature of solder bumps).

FIGS. 13-19 illustrate an interconnect assembly or package according to an exemplary embodiment during various stages of fabrication. The assembly shown in FIGS. 13-19 is fabricated according to flow 1, described above. Similar techniques may be applied to fabricate assemblies according to flows 2-4, as desired, and as persons of ordinary skill in the art understand.

Figure 13:
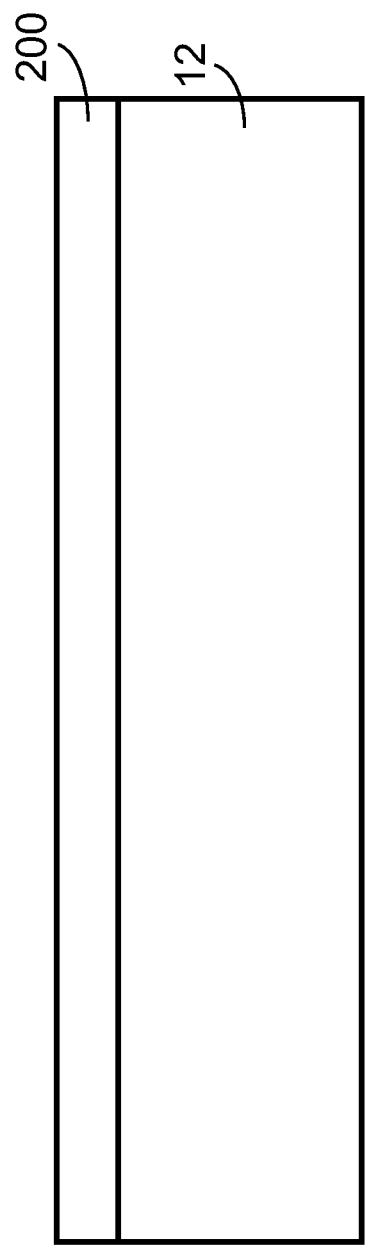

Referring to FIG. 13, starting with die 12, photoresist layer 200 is deposited or fabricated on top of the base material of die 12. In exemplary embodiments, photoresist layer 200 may be relatively thin (compared to other photoresist layers used, as described below in detail).

Figure 14:
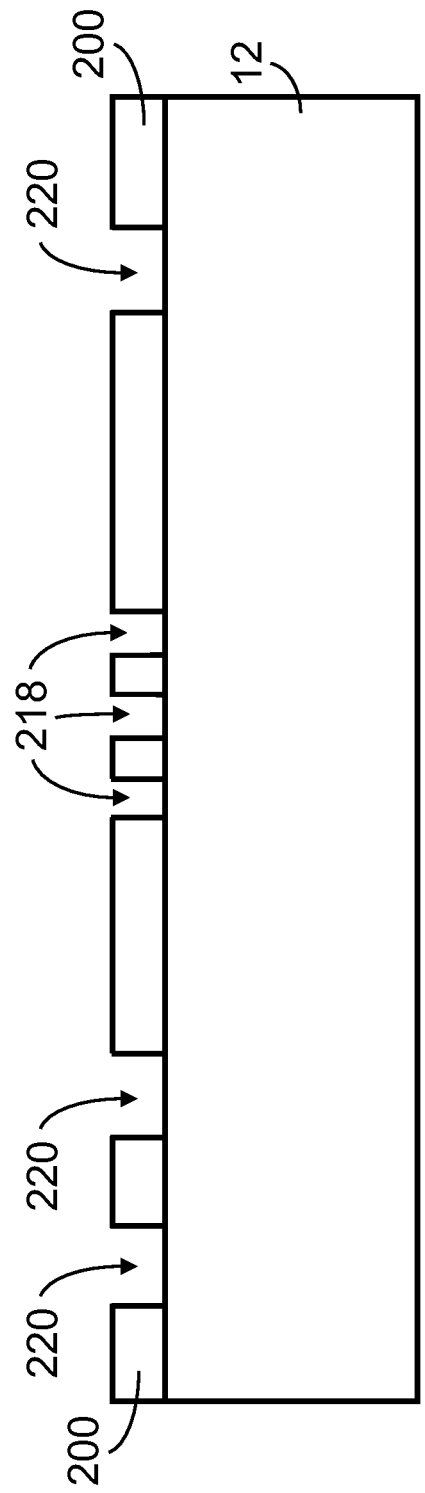

FIG. 14 shows the patterning of photoresist layer 200. Specifically, a technique, such as photolithography, may be used to open patterns or windows or openings or voids in photoresist layer 200. Thus, photoresist layer 200 may be etched to produce a series of openings. The positions and sizes of the openings correspond to the positions and desired thickness or diameter of copper pillars 18 and 20.

More specifically, a series of openings 220 corresponds to the locations where copper pillars 20 will be fabricated Likewise, a series of openings 218 corresponds to the locations where copper pillars 18 will be produced. The openings 218 and 220 provide a mechanism for depositing additional materials selectively, as persons of ordinary skill in the art understand.

Figure 15:
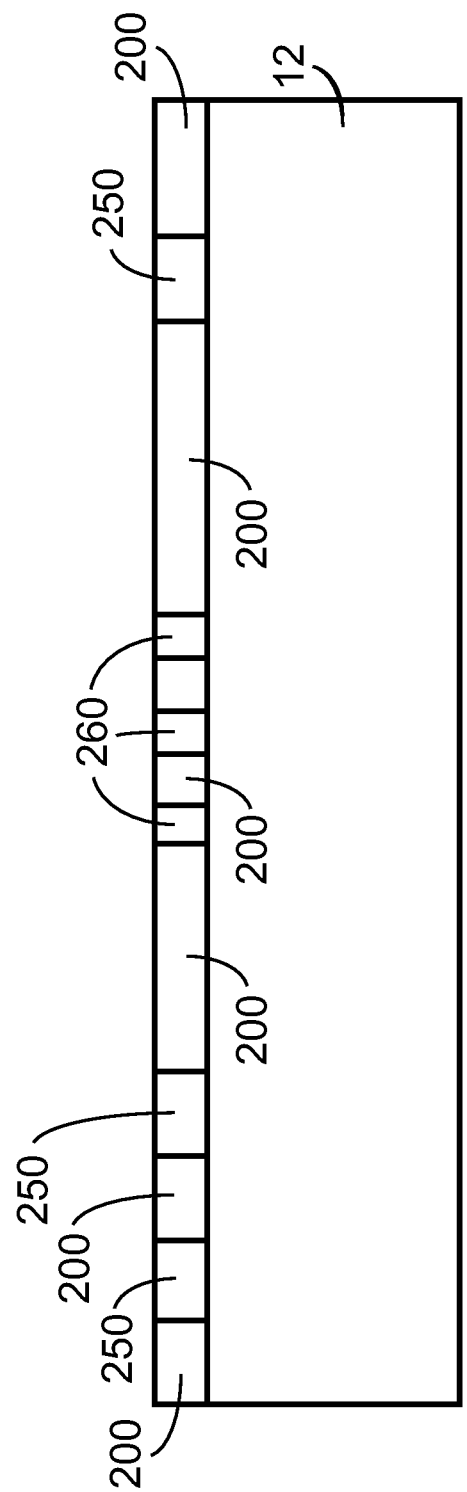

As FIG. 15 shows, subsequently, copper is deposited in openings 218 and 220. The copper deposited in openings 218 and 220 forms a portion of copper pillars 18 and 20, respectively. Because of the relative thinness of photoresist layer 200, in some embodiments a copper plating process may be used although, generally, any desired technique may be used to deposit copper, as persons of ordinary skill in the art understand.

The deposition of copper results in the filling of openings 218 and 220 with copper. The resulting copper deposits are labeled as 250 for areas corresponding to openings 220, and as 260 for areas corresponding to openings 218.

A chemical mechanical polish (CMP) step or process may be performed, as desired. The CMP step planarizes the surface of photoresist layer 200 and the copper deposited in openings 218 and 220. The planarization of photoresist layer 200 and the copper deposited in openings 218 and 220 facilitates further fabrication steps by, for example, resulting in a more uniform height of copper pillars 18 and copper pillars 20. The uniform heights allow a more precise bonding together of die 18, die 20, and substrate 16.

Figure 16:
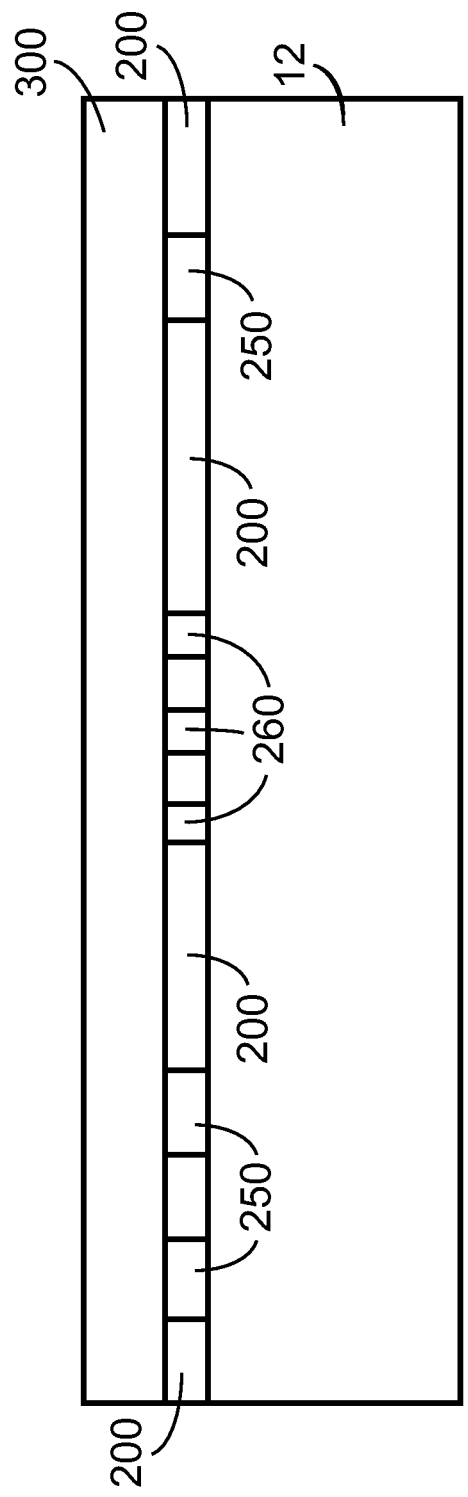

Next, an additional photoresist layer 300 is fabricated or deposited on die 12, as FIG. 16 illustrates. In exemplary embodiments, compared to photoresist layer 200, photoresist layer 300 is relatively thick. Furthermore, photoresist layer 300 may in exemplary embodiments be deposited or fabricated using a dry process (dry photoresist), as desired, although other techniques may be used, as persons of ordinary skill in the art understand.

Figure 17:
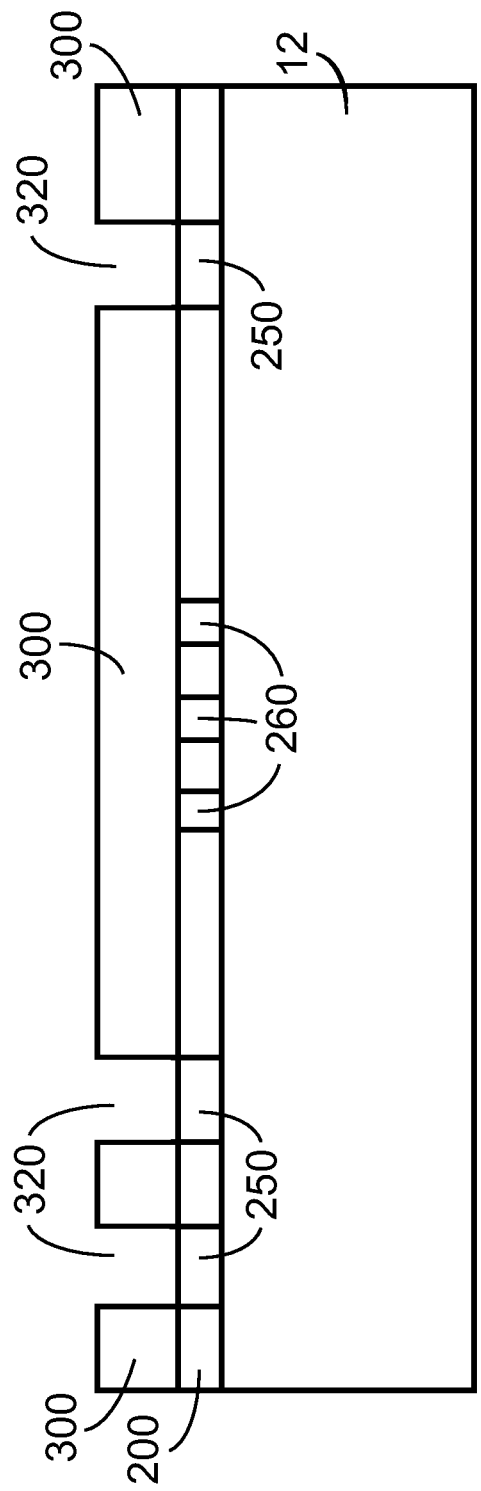

Referring to FIG. 17, a technique, such as photolithography, may be used to open patterns or windows or openings or voids in photoresist layer 300. Thus, photoresist layer 300 may be etched to produce a series of openings 320. The positions and sizes of the openings 320 correspond to the positions and desired thickness or diameter of copper pillars 20.

More specifically, openings 320 correspond to the locations where copper pillars 20 will be fabricated. Openings 320 provide a mechanism for depositing additional materials selectively, as persons of ordinary skill in the art understand. Note that the areas of photoresist layer 300 corresponding to copper pillars 18 are not etched. As a result, when additional copper is deposited in openings 320 (see below for the detailed description), copper pillars 20 will have an ultimate height that is larger or taller than the height of copper pillars 18.

Figure 18:
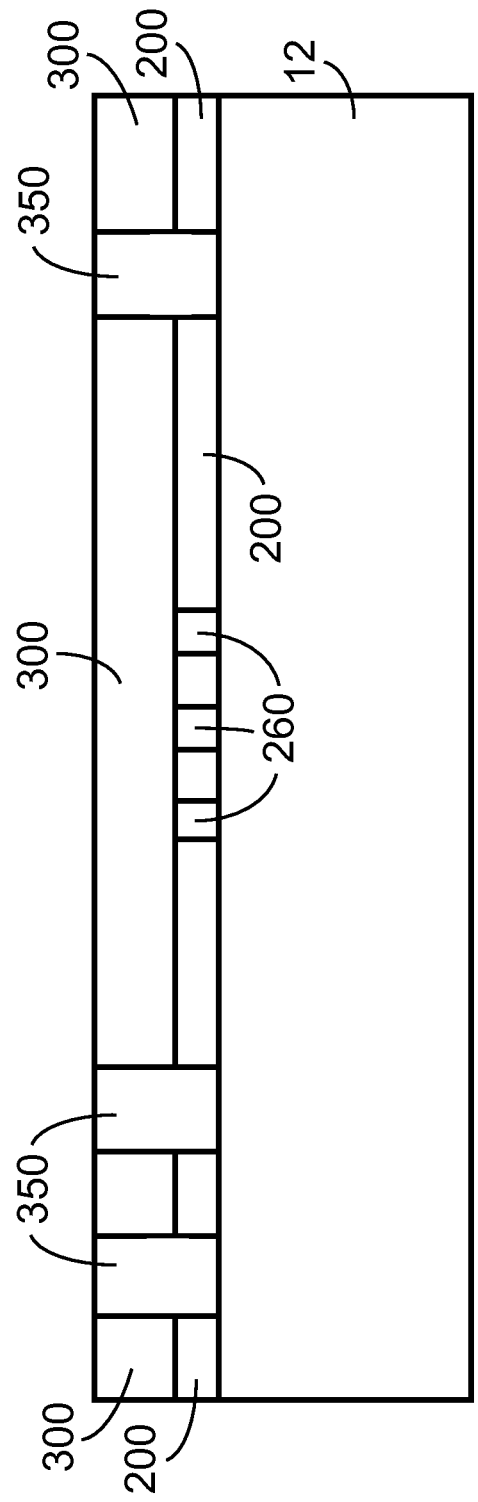

Next, copper is deposited in openings 320, as FIG. 18 illustrates. The copper deposited in openings 320 forms a portion of copper pillars 20. Generally, any desired technique may be used to deposit copper, as persons of ordinary skill in the art understand. The deposition of copper results in the filling of openings 320 with copper. The resulting copper deposits are labeled as 350 for areas corresponding to openings 320.

Deposited copper 350 (corresponding to copper pillars 20 may be plated, as desired. A CMP step or process may be performed, as desired. The CMP step planarizes the surface of photoresist layer 300 and the copper deposited in openings 320. The planarization of photoresist layer 300 and the copper deposited in openings 320 facilitates further fabrication steps by, for example, resulting in a more uniform height of copper pillars 20. The uniform heights allow a more precise bonding together of die 18, die 20, and substrate 16, as noted above. Copper deposits 350 may also be tinned or plated with tin (Sn), as desired.

The remaining portions of photoresist layers 200 and 300 are subsequently removed, leaving the structure shown in FIG. 19. More specifically, the resulting structure includes die 12, copper pillars 18, and copper pillars 20. As noted above, the use and selective etching of photoresist layer 300 results in copper pillars 18 being shorter than copper pillars 20.

Referring to FIGS. 11-19, similar steps as those described above apply to flows 2-4, as persons of ordinary skill in the art understand. Furthermore, the resulting structure will be similar to (but different than) those shown in FIGS. 13-19, as persons of ordinary skill in the art understand. With respect to the processing steps and the corresponding structures, as persons of ordinary skill in the art understand, a variety of other techniques, steps, structures, etc., may be used in exemplary embodiments. Thus, the disclosed embodiments constitute mere examples.

As noted, FIG. 10 describes four process flows. Process flows 2-4 provide alternatives to process flow 1. In this flow 2, pillars of two (or more) different heights may be processed or fabricated on different die. For example, in some embodiments, the tall pillars (e.g., copper pillars 20) may be processed on the larger device die (e.g., mother die, Die 1, die 12, etc.), which may also be viewed as a substrate die in some embodiments.

The shorter pillars (e.g., copper pillars 18) may be processed on the smaller die (e.g., daughter die, Die 2, die 14, etc.). The two die may then be bonded or interconnected to each other, using a desired technique, as described above, for example, and as persons of ordinary skill in the art understand. This fabrication technique reduces the complexity of processing two different heights on the same wafer or die.

In exemplary embodiments, the metallurgies of the pads to receive or bond to the coppers pillars during the assembly and the tops of the pillars may be standard materials (tin (Sn) for the tops of the pillars, for example). The assembly sequence may be the same or similar to the sequence described above with respect to flow 1, as persons of ordinary skill in the art understand.

Process flows 3 and 4 provide alternative fabrication techniques according to exemplary embodiments. Process flows 3 and 4 comprehend the potential of having the tall pillars created on the package substrate itself. Wafer level processes or processing may be more efficient, and the technique may provide a cost effective alternative if relatively tight uniformity is desired.

With respect to process flow 3, the taller copper pillars (e.g., copper pillars 20) are fabricated on substrate 16. The shorter copper pillars (e.g., copper pillars 18) are fabricated on the larger die (e.g., die 12). Pads, such as standard pads, are used on the smaller die (e.g., die 14). The smaller die (e.g., die 14) is then bonded to the larger die (e.g., die 12) and the shorter copper pillars (e.g., copper pillars 18). The resulting structure is bonded to substrate 16 and the taller copper pillars (e.g., copper pillars 20) to fabricate an interconnect between the two die and substrate 16.

Similarly, with respect to process flow 4, the taller copper pillars (e.g., copper pillars 20) are fabricated on substrate 16. The shorter copper pillars (e.g., copper pillars 18) are fabricated on the smaller die (e.g., die 14). Pads, such as standard pads, are used on the larger die (e.g., die 12). The larger die (e.g., die 12) is then bonded to the smaller die (e.g., die 14) and the shorter copper pillars (e.g., copper pillars 18). The resulting structure is bonded to substrate 16 and the taller copper pillars (e.g., copper pillars 20) to fabricate an interconnect between the two die and substrate 16.

The process flows, materials, structures, etc., described above correspond merely to exemplary embodiments. As persons of ordinary skill in the art understand, other embodiments may be used to create the multilevel copper pillars for the assemblies and packages described above. The choice of process flows and materials depends on a variety of factors (e.g., available technologies and materials used, specifications for a given use, cost, complexity trade-offs, etc.), as persons of ordinary skill in the art understand.

As persons of ordinary skill in the art understand, one may apply the disclosed concepts effectively to various types of circuitry or die. Examples described in this document constitute merely illustrative applications, and are not intended to limit the application of the disclosed concepts to other types of devices or die by making appropriate modifications. Those modifications fall within the knowledge and level of skill of persons of ordinary skill in the art. For example, rather than FPGA circuitry realized in a semiconductor die, other types of circuitry, known for instance as programmable logic device (PLD), complex PLD (CPLD), and the like, may be used.

The drawings illustrate only exemplary embodiments and therefore should not be considered as limiting its scope. Persons of ordinary skill in the art appreciate that the disclosed concepts lend themselves to other equally effective embodiments. As persons of ordinary skill in the art understand, the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A method of fabricating an electronic assembly, the method comprising:
    fabricating, using a photolithography process, a first interconnect comprising a first set of copper pillars, the first interconnect to interconnect a first die to a semiconductor substrate;
    fabricating, using the photolithography process, a second interconnect comprising a second set of copper pillars, the second interconnect to interconnect the first die to a second die; and
    assembling the first die, the second die, and the semiconductor substrate together such that the first die is disposed above the semiconductor substrate, and the second die is disposed below the first die.

2. The method according to claim 1, wherein fabricating the first and second interconnects further comprises fabricating the first and second sets of copper pillars such that the first set of copper pillars are taller than the second set of copper pillars.

3. The method according to claim 2, wherein fabricating the first interconnect further comprises fabricating the first set of copper pillars on the first die.

4. The method according to claim 3, wherein fabricating the second interconnect further comprises fabricating the second set of copper pillars on the first die.

5. The method according to claim 3, wherein fabricating the second interconnect further comprises fabricating the second set of copper pillars on the second die.

6. The method according to claim 1, wherein fabricating the first interconnect further comprises fabricating the first set of copper pillars on the semiconductor substrate.

7. The method according to claim 6, wherein fabricating the second interconnect further comprises fabricating the second set of copper pillars on the first die.

8. The method according to claim 6, wherein fabricating the second interconnect further comprises fabricating the second set of copper pillars on the second die.

9. The method according to claim 1, wherein fabricating the second interconnect further comprises coupling analog circuitry fabricated in one of the first and second die to digital circuitry fabricated in the other of the first and second die.

10. The method according to claim 1, wherein fabricating the second interconnect further comprises coupling analog or mixed-signal circuitry fabricated in one of the first and second die to digital circuitry fabricated in the other of the first and second die.

11. The method according to claim 1, wherein fabricating the second interconnect further comprises coupling field programmable gate array (FPGA) circuitry fabricated in one of the first and second die to circuitry fabricated in the other of the first and second die.

12. A method of fabricating an electronic assembly, the method comprising:
- fabricating a first interconnect, the first interconnect to interconnect a first die to a substrate;
- fabricating a second interconnect, the second interconnect to interconnect the first die to a second die;
- fabricating a third interconnect, the third interconnect to interconnect the first die to a third die; and
- assembling the first die, the second die, the third die, and the substrate together such that the first die is disposed above the substrate, the second die is disposed below the first die, and the third die is disposed below the first die,
- wherein assembling the first die, the second die, the third die, and the substrate together further comprises disposing the second die between the first die and the third die.

13. The method according to claim 11, wherein fabricating the first interconnect further comprises fabricating a first set of copper pillars, wherein fabricating the second interconnect further comprises fabricating a second set of copper pillars, and wherein fabricating the third interconnect further comprises fabricating a third set of copper pillars.

14. The method according to claim 13, wherein the first set of copper pillars are taller than the second set of copper pillars.

15. The method according to claim 14, wherein the second set of copper pillars are taller than the third set of copper pillars.

16. A method of fabricating an electronic assembly, the method comprising:
- fabricating, using a photolithography process, a first interconnect on a first die, the first interconnect comprising a first set of copper pillars;
- fabricating, using a photolithography process, a second interconnect on the first die, the second interconnect comprising a second set of copper pillars;
- interconnecting a second die to the first die using the second interconnect; and
- interconnecting the first die to a semiconductor substrate using the first interconnect such that the first die and the second die are disposed above the substrate.

17. The method according to claim 16, wherein interconnecting a second die to the first die using the second interconnect further comprises disposing the second die above the first die.

18. The method according to claim 17, wherein interconnecting the first die to a substrate using the first interconnect such that the first die and the second die are disposed above the substrate further comprises using a flip chip technique.

19. The method according to claim 16, wherein fabricating the first and second interconnects on the first die further comprises:
- fabricating a first photoresist layer;
- etching selectively the first photoresist layer to fabricate first and second sets of openings; and
- depositing copper in the first and second sets of openings.

20. The method according to claim 19, wherein fabricating the first and second interconnects on the first die further comprises performing a first planarization step.

21. The method according to claim 19, wherein fabricating the first and second interconnects on the first die further comprises:
- fabricating a second photoresist layer;
- etching selectively the second photoresist layer to fabricate a third set of openings; and
- depositing copper in the third set of openings.

22. The method according to claim 21, wherein fabricating the first and second interconnects on the first die further comprises performing a second planarization step.

23. The method according to claim 21, wherein fabricating the first and second interconnects on the first die further comprises etching the first and second photoresist layers.

\* \* \* \* \*